United States Patent [19]

Burch

[11] Patent Number: 5,399,425

[45] Date of Patent: Mar. 21, 1995

[54] METALLIZED POLYMERS

[75] Inventor: Robert R. Burch, Exton, Pa.

[73] Assignee: E. I. Du Pont de Nemours and Company, Wilmington, Del.

[21] Appl. No.: 930,133

[22] Filed: Aug. 14, 1992

Related U.S. Application Data

[63] Continuation of Ser. No. 641,251, Jan. 15, 1991, abandoned, which is a continuation-in-part of Ser. No. 216,406, Jul. 7, 1988, abandoned.

[51] Int. Cl.6 .......................... B32B 5/16; B32B 15/08
[52] U.S. Cl. ..................................... 428/328; 428/375; 428/381; 428/389; 428/458; 428/474.4; 428/704
[58] Field of Search ............... 428/375, 381, 389, 458, 428/474.4, 704, 328

[56] References Cited

U.S. PATENT DOCUMENTS

| | | | |
|---|---|---|---|
| 3,014,818 | 12/1961 | Campbell | 117/227 |
| 3,772,078 | 11/1973 | Polichette et al. | 116/212 |
| 3,915,809 | 10/1975 | Wheatley | 204/15 |
| 4,374,893 | 2/1983 | Arsac et al. | 428/263 |
| 4,634,805 | 1/1987 | Orban | 174/128 R |
| 4,710,403 | 12/1987 | Krause et al. | 427/304 |
| 4,775,556 | 10/1988 | Krause et al. | 427/272 |
| 4,785,038 | 11/1988 | Sweeny | 524/173 |
| 4,824,881 | 4/1989 | Kim et al. | 524/82 |

FOREIGN PATENT DOCUMENTS

| | | |
|---|---|---|
| 2820502 | 11/1979 | Germany . |
| 3139313 | 4/1983 | Germany . |
| 979122 | 1/1965 | United Kingdom . |

OTHER PUBLICATIONS

Jones et al., Material Letters, vol. 2, No. 5B, pp. 462–467 (1984).

Primary Examiner—D. S. Nakarani

[57] ABSTRACT

A method is disclosed for metallizing polymers comprising generating anionic sites on the structures, contacting same with the cation of the metal and then reducing the metal cation to metal at the anionic sites or treating the metal cations to form a semiconductor. The metallized polymers are useful as electrical conductors or semiconductors.

20 Claims, 3 Drawing Sheets

METALLIZED POLYMERS

CROSS-REFERENCE TO RELATED APPLICATION

This is a continuation of application Ser. No. 07/641,251, filed Jan. 15, 1991, now abandoned, which is a continuation-in-part of application Ser. No. 07/216,406, filed on Jul. 7, 1988, now abandoned.

BACKGROUND OF THE INVENTION

This invention relates to metallizing polymer structures in the form of films, fibers and other geometric shapes. The metallized polymer structures of the present invention are characterized in that metal uniformly penetrates into the polymer matrix. In the process for their preparation, metal cations are electrostatically bonded to the polymer, and then reduced to the metallic state. The reaction of metal cation with a semiconductor-forming compound likewise results in a semiconductor inbibed polymer.

U.S. Pat. No. 4,634,805 discloses conductive cable and woven polymer fabric in which the individual filaments are coated with an adherent metal. The method for accomplishing the coating operation requires substrate activation with palladium chloride and/or tin chloride.

German Application No. 2,820,502 discloses a process for metallizing polyamides by placing the polymer in an acidic colloidal palladium solution containing an excess of stannous ions. This activated material is then treated with an acid or a base and is subsequently coated with metal at room temperature by a currentless method using a basic metallic salt solution.

German Application No. 3,139,313 discloses polymer fibers metallized by a currentless method after palladium chloride surface activation.

Jones, et al., Materials Letters, Vol. 2, Number 5B, 462 to 467 (1984) discloses a hybrid cable consisting of a bundle of synthetic fibers coated with a thin metallic layer.

U.S. Pat. No. 4,374,893 discloses polyamides with permanent-conducting properties having on the surface a layer of copper sulfide with an atomic ratio of Cu/S of 1.5 to 2. Such polyamides are metallized by treating with hydrogen sulfide under pressure, followed by an aqueous solution of a copper salt, optionally in the presence of a swelling agent and a reducing agent. If no reducing agent is present in the copper salt solution, an after-treatment is carried out in the presence of a reducing agent.

U.S. Pat. No. 4,785,038 discloses a solvent system of liquid sulfoxide, a base and an alcohol or water for dissolving aromatic polyamides, polybenzimidazoles and polyureas which are known to be difficult to dissolve.

SUMMARY OF THE INVENTION

This invention concerns metallized polymers and a method for their production. The polymer can be a single polymer or a copolymer or composite. For the sake of brevity, the term "polymers" will be employed herein to designate all of such polymers in whatever geometric form they appear. The term "metal" will be employed to designate the coating or imbibing materials, it being understood that the term encompasses pure metals, including mixtures of metals, as well as metal-containing substances comprising other moieties as well, for instance, metal-containing semiconductors. The term "metallized" as used herein describes polymers which are metal coated, metal imbibed, or semiconductor imbibed. The imbibed polymers contain metal which has uniformly penetrated into the polymer matrix. The geometry of the polymer substrate before metallization, and of the metallized substrate, can vary, and will not influence the subject or method of this invention. Representative shapes include fibers and films.

One type of metallized polymer of this invention comprises a polymer structure characterized as follows:

(A) a polymer having at least one repeating unit selected from the group:

wherein:

R is selected from $R^3$ and $R^1NHCOR^2$, $R^1$ and $R^3$, individually, are selected from m-phenylene, p-phenylene, 3,3'-biphenylene, 3,4'-biphenylene, 4,4'-biphenylene and 4,4'-diphenylene ether, $R^2$ is selected from $R^1$ and $-(CH_2)_x$;

Ar is a trisubstituted aromatic radical in which two of the three radical bonds are adjacent to one another and attached to nitrogen atoms, and x is 1 to 10, preferably 1 to 4; said repeating unit further optionally substituted with halogen or $C_yH_{2y+1}$ wherein y is 1 to 10; and (B) a metal selected from any of Groups 8 through 12 of the Periodic Table of the Elements, chromium, lead and indium; said metal dispersed on the polymer surface and penetrating uniformly into the polymer matrix to a depth of at least 70 nanometers.

A second type of metallized polymer of this invention comprises:

(A) a polymer having at least one repeating unit as defined above for the first type of metallized polymer;

(B) a first metal selected from Groups 8 through 12 of the Periodic Table of the Elements, chromium, lead and indium, said metal dispersed in the polymer surface and penetrating uniformly into the polymer matrix to a depth of at least 70 nanometers; and (C) at least one coating containing one or more metals selected from Groups 8 through 12 of the Periodic Table of the Elements, chromium, lead and indium, said coating layered over said first metal; and said coating having
(a) an Adherence Factor of at least about 70%; and
(b) a Conductivity Value of greater than 0.1 reciprocal ohm per meter in at least 70% of the monofilaments.

The Adherence Factor represents a measure of the degree of adhesion of the coating to the polymer substrate and the Conductivity Value represents a measure of the uniformity and thickness of the coating on the polymer substrate.

A third type of metallized polymer of the present invention is semiconductor imbibed and is characterized as follows:

(A) a polymer having at least one repeating unit as defined above for the first type of metallized polymer; and (B) at least one metal selected from the group cadmium, cobalt, copper, iron, lead, nickel, germanium, tin, gallium, aluminum or zinc treated with a compound that forms a semiconductor therewith; said metal penetrating uniformly into the polymer matrix to a depth of at least 70 nanometers.

Optionally a coating containing one or more metals selected from Groups 8 through 12 of the Periodic Table of the Elements, chromium, lead, and indium can be layered over the semiconductor.

For each type of metallized polymer the depicted repeating units, polyamide, polyurea, and polybenzimidazole, respectively, can be substituted with one or more additional substituents that do not interfere with the process as described herein. Preferred among these optional substituents are those specified, i.e., halogen, most preferably chlorine and bromine, and $C_yH_{2y+1}$, wherein y is 1 to 10. Representative of contemplated trisubstituted aromatic radicals is 1,2,4-benzenetriyl.

The method of this invention for metallizing a polymer substrate comprises the steps (i), (ii), (iii) and optionally (v); or (i), (ii), (iv) and optionally (v):

(i) treating a polymer having at least one repeating unit as defined above with a nonaqueous solution of a strong base to generate anionic sites on the polymer surface, (ii) contacting the polymer with metal cation to electrostatically bond the cation to the anionic sites, and (iii) reducing the metal cation to metal at the anionic sites on the polymer surface and forming metallic sites, or (iv) treating the metal cation generated in step (ii) above with a compound that forms a semiconductor therewith and forming a semiconductor imbibed polymer; and (v) optionally coating the polymer of step (iii) or (iv) with a metal using electroless plating or electrodeposition.

A contemplated variation of the method of this invention comprises mixing the desired polymer polyanion solution with the desired metal cation to form a viscous solution, shaping the mixture, reprotonating the polyanion, and reducing the metal cation to metal or treating it as described hereafter to make it semiconductive. In this variation, it is most convenient to cast films or fibers of the solution mixture before reduction to the metal or treatment to form a semiconductor.

DETAILS OF THE INVENTION

Figure 1:
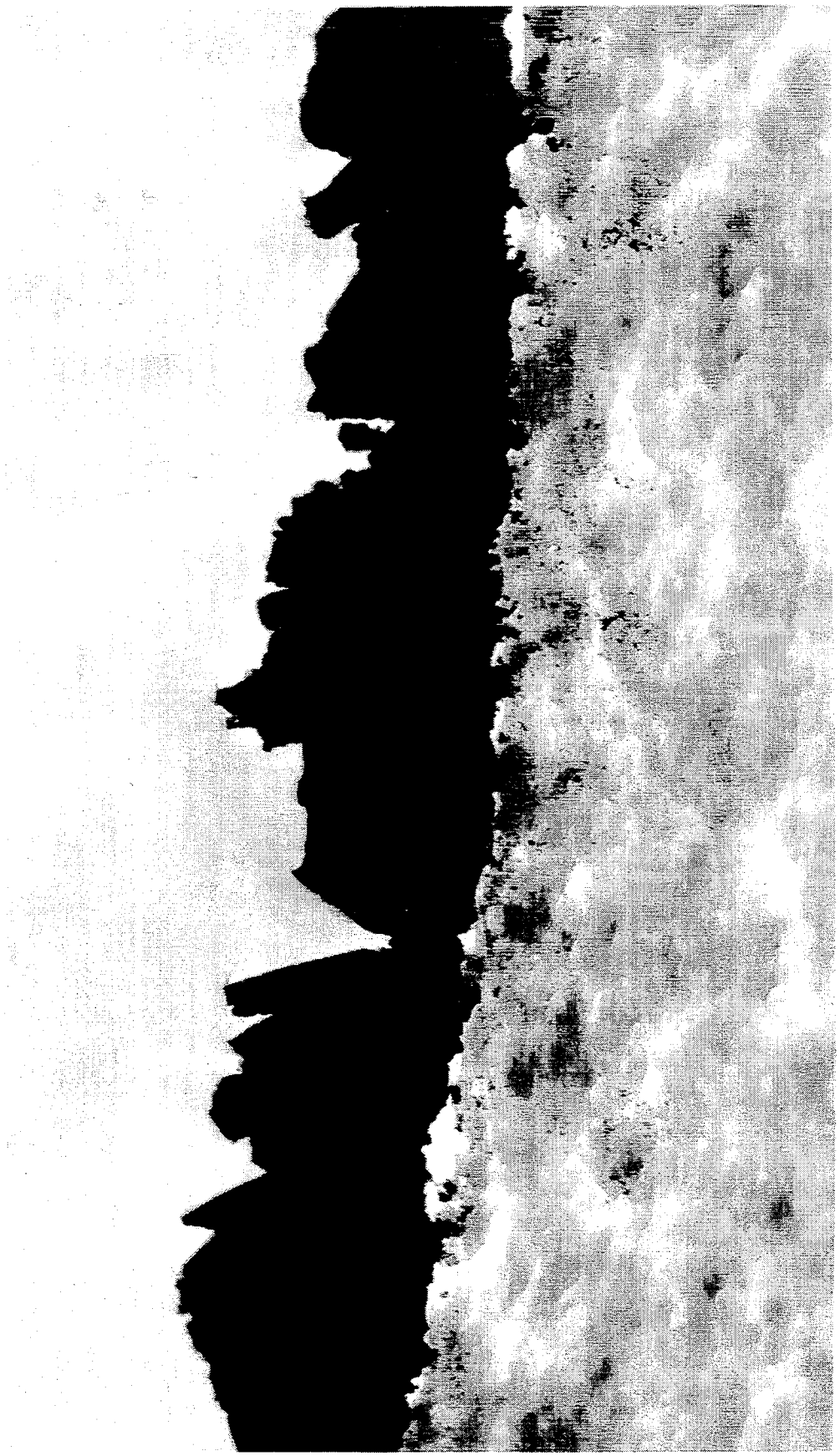
FIG. 1 represents an electron micrograph of a cross-section of a metallized polymer film treated by the method of U.S. Pat. No. 4,634,805. Scale: 1 cm=170 nm.

All of the contemplated polymers of this invention have at least one repeating unit selected from the group:

—NHRCO—, $R^1$—NHCONH— or 

wherein:

R is selected from $R^3$ and $R^1NHCOR^2$, $R^1$ and $R^3$, individually, are selected from m-phenylene, p-phenylene, 3,3'-biphenylene, 3,4'-biphenylene, 4,4'-biphenylene and 4,4'-diphenylene ether, $R^2$ is selected from $R^1$ and $-(CH_2)_x$, Ar is a trisubstituted aromatic radical in which two of the three radical bonds are adjacent to one another and attached to nitrogen atoms, and x is 1 to 10, preferably 1 to 4. The depicted repeating units, polyamide, polyurea, and polybenzimidazole, respectively, can be substituted with one or more additional substituents that do not interfere with the process as described herein. Preferred among these optional substituents are halogen, most preferably chlorine and bromine, and $C_yH_{2y+1}$, wherein y is 1 to 10. Representative of contemplated trisubstituted aromatic radicals is 1,2,4-benzenetriyl.

When the polymer comprises repeating units of $R^3$ solely, it can be characterized as a homopolymer. Homopolymers are also formed when $R^1$ and $R^2$ are the same throughout the polymer. Copolymers result when $R^1$ and/or $R^2$ vary within the polymer matrix.

The polymers of this invention should have a weight average molecular weight of about 2500 or more. Preferred molecular weights are at least about 3300, indicated by an inherent viscosity of about 0.4 or greater measured at 0.5% concentration in concentrated (95% to 98%) sulfuric acid at 30° C.

Contemplated polymers include poly(paraphenylene terephthalamide) [PPTA], poly(metaphenylene isophthalamide) [PMIA], poly(parabenzamide), poly(4,4'-biphenylene isophthalamide), poly(benzimidizoles), poly(chloroparaphenylene isophthalamide) and copolymers thereof.

In the method of the present invention, typically, the polymer substrate is first treated with a solution of a strong base to generate surface anionic sites. The treated structure is then contacted with a solution of the desired metal cation which is adhered to it via ion exchange. The metal cation is then treated with a compound that forms a semiconductor to yield a semiconductor imbibed polymer or is reduced to the metal state by interaction with the polymer structure to obtain a metal imbibed polymer. If the polymer structure is not of sufficient reduction potential, the cation is reduced by interaction with a solution of a strong reducing agent. Optionally, a second metal is then deposited via electroless plating or electrodeposition to obtain a metal coated polymer.

Strong bases which can be used in the process of the invention include alkali metal hydroxides (OH—); $R^4R^5N$—, wherein $R^4$ and $R^5$ are selected from the group consisting of $C_1$-$C_{12}$ alkyl, $C_6H_5$, $C_{10}H_7$, $C_{12}H_9$, $C(=O)R^6$ wherein $R^6$ is $C_1$-$C_{12}$ alkyl; $CH_2CN$—; $R^7$— wherein $R^7$ is $C_1$–$C_{12}$ alkyl; H—; $R^8SOR^9$— wherein $R^8$ and $R^9$ are each $C_1$–$C_{12}$ alkyl; or $R^{10}O$— wherein $R^{10}$ is $C_1$–$C_{12}$ alkyl; and the polyanions of the polymers described above.

The preferred bases include $R^8SOR^9$— and RO—. The most preferred bases are $CH_2SOCH_3$—, potassium t-butoxide, and the polyanions of the polymers described above either used alone or in the presence of alcohols, amines or nitrates. One preferred mixture of bases is potassium t-butoxide and lithium nitrate. It is advantageous to have more than one alkali metal cation present. The concentration of base in solution can range from 0.001M to 6M. The most preferred range is 0.1M to 1.0M.

Solvents which are suitable for the invention include sulfoxides such as $R^{11}SOR^{12}$ wherein $R^{11}$ and $R^{12}$ can be the same or different and are $C_1$–$C_5$ alkyl. The most preferred solvent is dimethylsulfoxide (DMSO).

Solvent and solvent mixtures which are suitable include $R^{11}SOR^{12}$ and $R^{11}SOR^{12}$ mixed with a polar non-protic solvent such as N-methylpyrrolidone or tetrahydrofuran. Preferred solvent mixtures contain greater than 10% DMSO. Most preferred solvent mixtures contain greater than 50% DMSO. It is important to the present invention that the combination of base and solvent cause swelling of the polymers, as this permits improved contact with the reagents. Solvents and solvent combinations which cause swelling are known in the art. See U.S. Pat. No. 4,785,038.

The process of the present invention can be operated at temperatures that vary depending on the particular solvent that is employed, typically varying between the melting and boiling points of said solvent. For example, when the solvent is DMSO, the temperature range will be 17° C. to 190° C. Preferred temperature range is room temperature to about 60° C. The process can be operated most conveniently at a pressure of subatmospheric to 35,000 psig (2382 atm.).

Metals which can be used for the metallization of the polymer substrate include those in Groups 8 through 12 of the Periodic Table of the Elements plus chromium, lead and indium. Preferred metals include copper, silver, gold, cadmium, zinc, platinum, iron, cobalt, chromium, tin, lead, rhodium, ruthenium, and nickel either individually or as mixtures. Of said metals, cadmium, cobalt, copper, iron, lead, nickel, germanium, tin, gallium, aluminum and zinc can be employed to make the semiconductive coating. The concentration of these metal cations in the treating solution should be at least 0.01M. Typically, the concentration of metal cations is about 0.2M. Any metal or metal complex can be used that has appropriate solubility in the solvent of choice.

To prepare the semiconductor imbibed polymers of this invention, steps (i), (ii) and (iv) and optionally (v) of the method of this invention are employed. To imbibe the polymer with a semiconductor, the polymer is treated with a strong base to generate anionic sites on its surface and then contacted with an appropriate metal cation as previously described. The metal cation is not reduced but is instead treated with a compound that forms a semiconductor therewith. Various sulfides, selenides or the like known in the art can be employed to produce the semiconductor. This method is especially useful for imbibing a semiconductor in a polymer fiber such as poly(paraphenylene terephthalamide), available from E. I. du Pont de Nemours and Company as KEVLAR ®, poly(paraphenylene) terephthalamide.

For the metal imbibed polymers, use of a reducing agent may be necessary with some metals to reduce the cation to the metallic state. Reducing agents suitable for the process of this invention include but are not limited to metal hydrides, hydrazines, electropositive metals, metal complexes, organometallics, borohydrides, boranes and alkylboranes as well as the particular polymer polyanions described herein.

After reduction of the cation to metal or treatment to form a semiconductor, a second metal optionally can be deposited thereon. The additional metal coating can be applied by electrodeposition or by electroless plating techniques. The latter can be employed to deposit metal on the surface already activated by the first metal using steps (i), (ii) and (iii) or (i), (ii) and (iv) of the method of this invention. Materials suitable for use in activation include the ions of silver, copper, tin, gold, nickel and palladium. Most preferred for use as the activating metal is silver or tin. Metals suitable for the outer coatings include those previously listed as suitable for metallization of the polymer substrate and include those in Groups 8 through 12 of the Periodic Table of the Elements, chromium, lead or indium. Use of the optional electroless plating permits exposure time to the base solution and metal cation solution to be minimized, often to only a few seconds. The electroless plating yields a coated polymer surface that is highly reflective, smooth and uniform. For example, a polymer treated with silver using steps (i), (ii) and (iii) of the method of the present invention, followed by electroless plating with copper has an electrical resistance nearly as low as bulk copper metal.

In all of the polymers of the present invention, due to the bonding of metal to polymer, the metal penetrates uniformly into the polymeric matrix, to a depth of at least 70 nanometers. Typically, much of the metal will penetrate to a depth of about 100 to 500 nanometers. The metallized polymers of the present invention therefore can be distinguished from those prepared by known methods by electron microscopy and scanning transmission electron microscopy due to this penetration of the metal into the polymer matrix. Metallized polymers prepared by previously known methods typically may have metal sporadically distributed through the polymer surface layer but lack the uniform penetration into the polymer matrix. This penetration results from the ion exchange reaction between the anionic sites generated in the polymer matrix swelled by the base/solvent combination and the metal cations. The penetration generates superior adhesion of metal to polymer.

Figure 2:
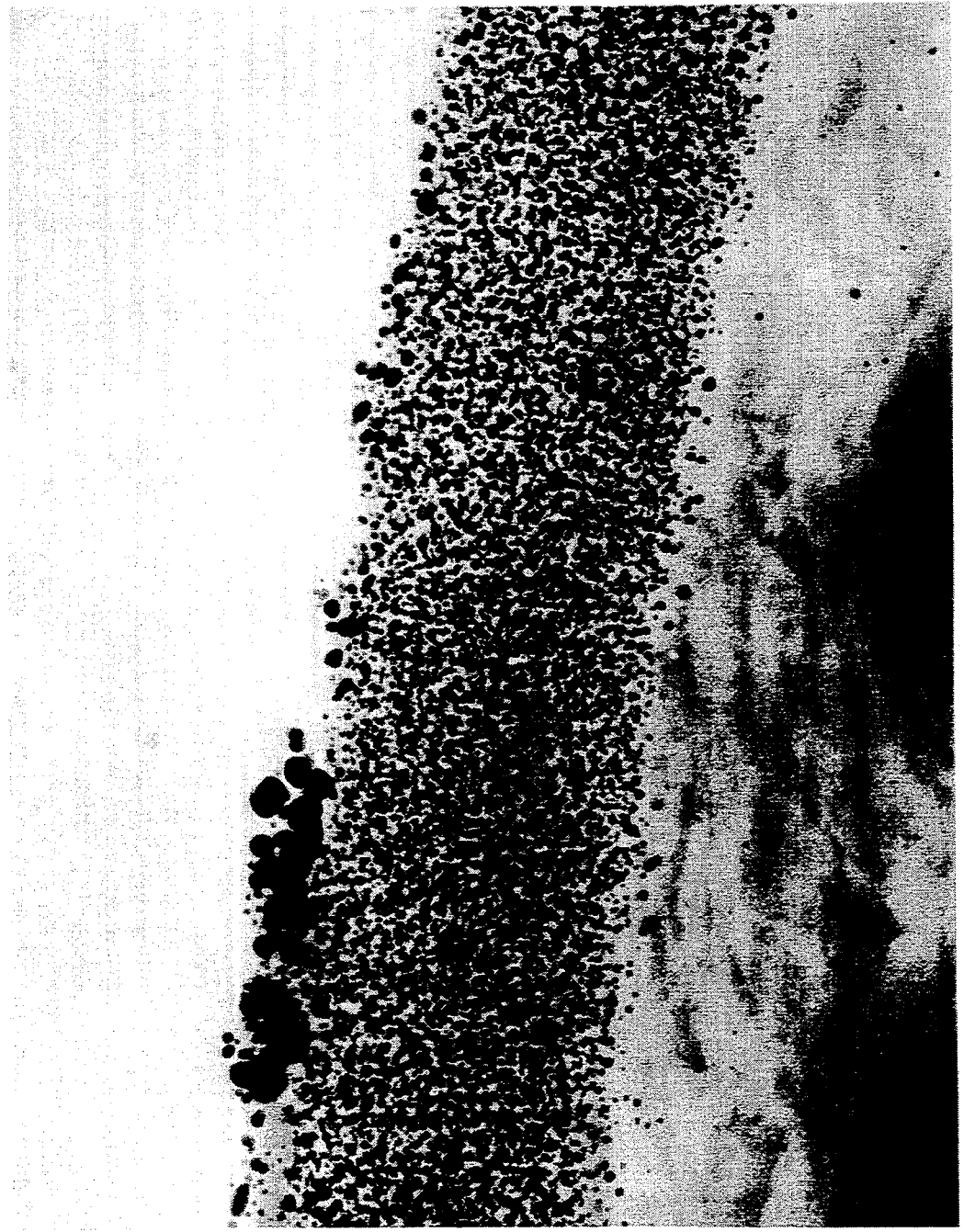
FIG. 2 represents an electron micrograph of a cross-section of a metal imbibed polymer film treated according to steps (i), (ii) and (iii) of the method of the present invention. Scale: 1 cm=200 nm.
Figure 3:
FIG. 3 represents an electron micrograph of a cross-section of a metal imbibed and coated polymer film treated according to steps (i), (ii), (iii) and (v) of the method of the present invention. Scale: 1 cm=170 nm.

This is demonstrated by the electron micrographs represented in FIGS. 1, 2 and 3. FIG. 1 is a cross-section of a metallized poly(paraphenylene terephthalamide) film prepared by using the prior art method of U.S. Pat. No. 4,634,805 as described in Example 15. The metal appears sporadically distributed on the polymer surface with little or no penetration into the polymer matrix. FIG. 2 is a cross-section of a metal imbibed poly(paraphenylene terephthalamide) film treated according to steps (i), (ii) and (iii) of the method of the present invention. The penetration of the silver metal into the polymer matrix can be clearly seen. FIG. 3 is a cross-section of a metal coated poly(paraphenylene terephthalamide) film treated according to steps (i), (ii), (iii) and (v) of the method of the present invention resulting in a polymer having copper coated over imbibed silver. The penetration of the silver into the polymer matrix is clearly evident.

For the coated polymers prepared from steps (i), (ii), (iii) and (v) of the method of the present invention, the coating of metal contained on the final product can range from 0.001 to 100 micrometers thick. This type of coated polymer has a more uniform coating of metal to polymer and better adhesion of metal on polymer than previously known coated polymers. The coated polymers prepared by steps (i), (ii), (iii) and (v) of the method of the present invention have an Adherence Factor of at least about 70. The Adherence Factor is a measure of the degree of adhesion of the coating to the polymer substrate. It is the percentage of coating on a coated sample in film form that does not separate from the substrate when tested in accordance with ASTM D3808-79 (Reapproved 1984) published December, 1979, which is hereby incorporated by reference.

These same coated polymers have a Conductivity value of at least about 70. This criterion measures the uniformity of the coating on the polymer substrate by determining the electrical conductivity of monofilaments. Areas of discontinuities in the coating or variable coating thickness which can adversely affect the ability of the composition to conduct electricity are minimized or eliminated in the claimed invention. The Conductivity Value is measured as follows. Representative single coated filaments are mounted on a solid support. Silver paste is applied to the filaments at one centimeter intervals to act as conductor leads. Upon application of a voltage to the leads, the presence of conductivity is determined. For polymers of the present invention, at least 7 out of 10, or 70%, of the filaments will show conductivity greater than 0.1 reciprocal ohm per meter.

The following Examples illustrate the invention.

EXAMPLE 1

Silver-imbibed poly(paraphenylene terephthalamide) [PPTA] yarn was prepared as follows. Six inch lengths of PPTA yarn were washed with water, followed by acetone and methylene chloride and then oven-dried. Sections of yarn were dipped for five minutes into a solution of 0.5M potassium t-butoxide in DMSO. This generated an orange gel on the surface of the fibers. The yarn was then placed into a solution of 0.5M silver trifluoroacetate in DMSO for two minutes. This caused the orange gel to become black. The yarn was next placed in a solution of 0.5M sodium borohydride in DMSO for two minutes. This caused no further color change, but gas evolution took place from the fiber surface. Finally, the yarn was washed with water, followed by acetone, and then hexane. The yarn sample was then air-dried. A second section of PPTA yarn was similarly treated only with residence times of two minutes in the potassium t-butoxide solution, one minute in the silver trifluoroacetate solution, and two minutes in the sodium borohydride solution. Conductivity measurements showed that both of these samples were electrical conductors.

EXAMPLE 2

Copper-imbibed poly(paraphenylene terephthalamide) [PPTA] yarn was prepared as follows. Six inch lengths of PPTA yarn were washed with water, followed by acetone and methylene chloride and then oven dried. Sections of the PPTA yarn were dipped first in a solution of 0.5M potassium t-butoxide in DMSO for two minutes. Then the yarn was transferred to a solution of 0.5M cuprous bromide dimethyl sulfide complex in DMSO for two minutes. The yarn was then placed in a solution of 0.5M sodium borohydride in DMSO for thirty minutes. The resulting copper imbibed yarn was then rinsed liberally with water and vacuum-dried.

EXAMPLE 3

Copper-imbibed poly(paraphenylene terephthalamide) [PPTA] yarn was prepared as follows. PPTA yarn was coated with copper by a procedure identical to that of Example 2, except that 0.5M of copper bis-trifluoromethanesulfonate benzene complex in DMSO was used in place of the cuprous bromide complex. The resulting copper imbibed yarn was electrically conductive.

EXAMPLE 4

Nickel sulfide semiconductor-imbibed poly(paraphenylene terephthalamide) [PPTA] films were prepared as follows. A solution of 0.10 g of nickel chloride hydrate in 2 ml of DMSO was added to a solution of 74.9 g of a 1.33 weight percent PPTA polyanion solution as the potassium salt. A gel immediately formed, but vigorous stirring restored a viscous solution with some small gel particles. The resulting solution was used to cast a film which was quenched with water to restore the neutral PPTA polymer. Treatment of the film with an aqueous solution of sodium sulfide gave a PPTA film containing nickel sulfide particles.

EXAMPLE 5

Semiconductor-imbibed poly(paraphenylene terephthalamide) [PPTA] fibers were prepared as follows. A solution of 0.10 g nickel acetylacetonate in 4 ml of DMSO was added to a solution of 75.4 g of 1.28 weight percent PPTA polyanion solution as the potassium salt. The solution became a gel. Addition of 1.32 ml of methanol converted the gel to a viscous solution. Fibers were prepared by extruding this solution from a syringe needle into an aqueous quench bath. The fibers were liberally rinsed with water and then with acetone and then dried. The dried fibers were treated with an aqueous solution of sodium sulfide to give PPTA fibers containing nickel sulfide. Elemental analysis showed that the fibers, before sodium sulfide treatment, contained 1.7% nickel.

EXAMPLE 6

Nickel sulfide semiconductor-imbibed poly(paraphenylene terephthalamide) [PPTA] fibers were prepared as follows. PPTA fibers were dipped into a solution of 0.5M potassium t-butoxide in DMSO for one minute and then into a solution of 0.08M nickel acetyl acetonate for one minute. The fibers were rinsed liberally with THF followed by pentane and then treated with aqueous sodium sulfide, rinsed with water, and dried to give nickel sulfide coated PPTA fibers. Reaction times were also varied: one minute in the potassium t-butoxide solution and three minutes in the nickel acetyl acetonate solution and also three minutes in the potassium t-butoxide solution and thirty minutes in the nickel acetyl acetonate. In all three cases, elemental analysis showed that the fibers contained between 1 and 2 weight percent nickel.

EXAMPLE 7

Nickel-imbibed poly(paraphenylene terephthalamide) [PPTA] fibers were prepared as follows. PPTA fibers were immersed in a solution of 0.2M potassium dimsyl in DMSO for one minute and then for three minutes in a solution of 0.5M nickel chloride hydrate in DMSO and finally in 0.5M sodium borohydride in DMSO for three minutes. The resulting black PPTA fibers were washed liberally with water, then acetone, and then dried. This process gave PPTA fibers imbibed with nickel metal.

EXAMPLE 8

Nickel-coated poly(paraphenylene terephthalamide) [PPTA] film was prepared as follows. A section of PPTA film was immersed momentarily in a 0.1M solution of potassium t-butoxide in DMSO and then in a 0.1M solution of silver trifluoroacetate in DMSO. The film was washed liberally with water and dried. Nickel was plated onto this silver-treated film using a traditional method of electroless plating as follows: a section of the film weighing 0.038 g was immersed in a solution of 5.0 g of nickel chloride hydrate and 0.2 g dimethyl amine borane in a mixture of 50 ml of water and 50 ml of dimethyl formamide for one and one-half hours. The film was then rinsed liberally with water and dried in a vacuum oven at 110° C. for 2 hours. The resulting nickel imbibed film weighed 0.095 g and was electrically conductive.

EXAMPLE 9

Copper-coated poly{paraphenylene terephthalamide) [PPTA] fibers and films were prepared as follows. PPTA fibers and PPTA films were immersed in a solution of 0.1M potassium dimsyl in DMSO for several seconds at room temperature and then into a solution of 0.1M silver trifluoroacetate for several seconds at room temperature. The fibers and films were rinsed with water and dried by means of a vacuum. The fibers and films were then immersed for several seconds into a copper electroless plating bath consisting of 22.7 g of copper sulfate penta-hydrate, 12.5 g of sodium carbonate, 70.0 g of sodium potassium tartrate, and 9.0 g of ethylenediaminetetraacetic acid all in 400 ml of deionized water to which was added a solution of 20.0 g of sodium hydroxide in 100 ml of water and 65 ml of a 37% formaldehyde solution. A typical copper metallized PPTA film prepared in this way had a copper layer 0.1 microns in thickness by microscopy and with an electrical conductivity of $1.56 \times 10^5$ (ohm sec)$^{-1}$ by the four point probe method, ASTM F390-78 (Reapproved 1984) published June 1978, hereby incorporated by reference.

EXAMPLE 10

Copper-coated poly(paraphenylene terephthalamide) [PPTA] paper was prepared as follows. A sample of commercial paper comprising a copolymer of PPTA with poly(metaphenylene isophthalamide) [PMIA] was soaked in a DMSO/NMP mixture to remove the PMIA. The PPTA was then coated heavily with a layer of PPTA polyanion solution and rinsed with water to give a PPTA bonded paper with a smooth, film-like coating of PPTA. The resulting paper was then immersed in 0.1M potassium dimsyl solution in DMSO for several seconds at room temperature and then in 0.1M silver trifluoroacetate in DMSO and then rinsed with water and dried by means of a vacuum. The paper was then immersed in a copper electroless plating bath for approximately 2 minutes, rinsed with water and dried in a vacuum to give a copper coated PPTA with an electrical resistance approximating that of metallic copper.

EXAMPLE 11

Copper was electroplated on copper-coated poly(paraphenylene terephthalamide) [PPTA] by the following method. A section of copper-coated PPTA fibers weighing 0.031 g was attached to the negative terminal of a 6 volt battery, and the fibers were immersed in a solution of 30 g of copper sulfate in 300 ml of deionized water. A copper wire was attached to the positive terminal of the battery and immersed into the solution. Electroplating for a total of 25 minutes gave PPTA fibers with a thick coat of copper. The copper uptake was 0.21 g and had an electrical resistance approximating that of bulk copper metal.

EXAMPLE 12

Lithium diisopropylamide was used as a base for activation of Kevlar ® for silver deposition. 1.07 g lithium diisopropylamide was dissolved in 100 mL of degassed anhydrous DMSO to give a 0.1M solution. KEVLAR-49 ®, poly(paraphenylene) terephthalamide 1140 denier yarn was dipped into the solution for approximately two minutes. Then the yarn was dipped into a 0.2M solution of silver nitrate in DMSO for approximately 30 seconds during which time the fiber became a deep gray color. The yarn was then washed liberally with water, dried, and subsequently plated with copper by means of electroless plating. The fibers showed conductivity consistent with a copper conductor. The adhesion of copper to the fibers was good as evidenced by the fact that adhesive tape did not remove copper from the fibers.

EXAMPLE 13

Potassium t-butoxide/lithium nitrate mixtures were used as a base for activation of KEVLAR ®, poly(paraphenylene) terephthalamide for silver deposition. 3.45 g lithium nitrate and 2.24 g potassium t-butoxide were dissolved in 100 mL DMSO to give a DMSO solution that was 0.5M in lithium nitrate and 0.2M in potassium t-butoxide. Kevlar-49 ® yarn was dipped into the potassium t-butoxide/lithium nitrate solution for 30 seconds and then into a 0.2M silver nitrate solution in DMSO to give deep gray colored yarn. The yarn was washed liberally with water, dried and then electrolessly plated with copper to give yarn with metallic levels of conductivity over at least six foot segments and with excellent copper adhesion as judged by application of adhesive tape.

EXAMPLE 14

Silver coated KEVLAR ®, poly(paraphenylene) terephthalamide fibers were prepared as follows. A section of KEVLAR-49 ®, poly(paraphenylene) terephthalamide knit fabric was soaked for approximately ten minutes in a DMSO solution that was 0.4 molar in potassium t-butoxide and 0.7 molar in lithium nitrate. The fabric was then rinsed in DMSO and then soaked in a 0.2 molar solution of anhydrous stannous chloride in DMSO for five minutes. The reaction was then quenched in water, and the KEVLAR ®, poly(parapheneylene) terephthalamide was washed liberally in water and finally dried with acetone. The resulting activated KEVLAR®, poly(parapheneylene) terephthalamide was metallized by means of a standard silver electroless plating solution to give silver coated KEVLAR®, poly(parapheneylene) terephthalamide fibers with excellent adhesion of metal to the fibers and with resistance of approximately 2 ohms per square.

EXAMPLE 15

The adhesion of a copper layer to poly(paraphenylene terephthalamide) [PPTA] films metallized by the claimed and known prior art methods was tested. The assessment of adhesion was in accordance with ASTM D3808-79 for the qualitative determination of adhesion. A representative sample of PPTA film was metallized by the method of U.S. Pat. No. 4,634,805 which is hereby incorporated by reference. A sample of the film was soaked in an aqueous solution that was 0.1M in palladium chloride and 0.1M in HCl for two minutes. The sample was then soaked for two minutes in an aqueous solution that was 0.1M in stannous chloride and 0.1M in HCl. The film was then electrolessly plated with copper. A representative sample of PPTA film was metallized by the present invention as in Example 9. Each were divided into six 1"×1" squares. Adhesive tape was applied to each of the squares. The tape was then removed from the substrate. The six PPTA samples from the method of the prior art showed poor uniformity, with about 70% of the samples showing the desired copper metallic lustre, the remaining 30% showing a gray black haze suggestive of a poorly formed copper layer. Adhesive tape applied to the six test samples showed that the adhesion was qualitatively good in two of the six squares. In the four samples that showed poor adhesion, the failure occurred at the copper/aramid interface as determined visually. In contrast, the six test squares from the present invention showed a uniform coating of copper with the characteristic lustre and showed qualitatively good adhesion in five of the six test samples.

KEVLAR®, poly(paraphenylene) terephthalamide fibers metallized by the claimed and prior art techniques were also examined for uniformity of the copper coating by determining the electrical conductivity of monofilaments. The KEVLAR®, poly(paraphenylene) terephthalamide fibers metallized by the prior art are the commercially available fibers obtained from Materials Concepts Inc., 666 North Hague Avenue, Columbus, Ohio 43204. Representative single filaments Were mounted on a solid support. Silver paste was applied to the filaments at one centimeter intervals to act as conductor leads. Copper coated Kevlar® monofilaments from the prior art showed metallic levels of electrical conductivity in 3 of 14 one centimeter segments. Copper coated KEVLAR®, poly(paraphenylene) terephthalamide monofilaments prepared by the present invention showed metallic levels of electrical conductivity in 13 of 18 one centimeter segments.

EXAMPLE 16

Poly(paraphenylene terephthalamide) [PPTA] films metallized with copper by the claimed and previously known methods were subjected to electron microscopy. The prior art method involved treatment of the aramid sequentially with stannous ion solution and palladium ion solution followed by electroless plating. PPTA was treated according to the present invention in a manner similar to Examples 12 and 13. Upon inspection with electron microscopy both films showed a copper surface layer. The PPTA of the present invention showed a uniform layer of silver particles impregnating the polymeric matrix in a layer just beneath the copper surface layer. The silver particles were present to a depth of about 100 to 500 nanometers. The PPTA coated using the prior art method showed palladium particles sporadically distributed through the polymer surface layer with poor penetration into the polymeric matrix. No tin was evident.

I claim:

1. A metallized polymer structure comprising
   (A) a polymer having at least one repeating unit —NHRCO—, wherein
      R is $R^3$ or $R^1NHCOR^2$, $R^1$ and $R^3$, individually, are m-phenylene, p-phenylene, 3,3'-biphenylene, 3,4-biphenylene, 4,4'-biphenylene or 4,4'-diphenylene ether,
      $R^2$ is $R^1$ or $-(CH_2)_x-$, and
      x is 1 to 10; and
   (B) a metal selected from the group consisting of any of Groups 8 through 12 of the Periodic Table of the Elements, chromium, lead and indium, said metal dispersed in a surface of the polymer up to about 500 nanometers.

2. A metallized polymer structure comprising
   (A) a polymer having at least one repeating unit —NHRCO—, wherein
      R is $R^3$ or $R^1NHCOR^2$, $R^1$ and $R^3$, individually, are m-phenylene, p-phenylene, 3,3'-biphenylene, 3,4-biphenylene, 4,4'-biphenylene or 4,4'-diphenylene ether,
      $R^2$ is $R^1$ or $-(CH_2)_x-$, and
      x is 1 to 10;
   (B) a first metal selected from the group consisting of any of Groups 8 through 12 of the Periodic Table of the Elements, chromium, lead and indium, said metal dispersed in [the] a surface of the polymer up to about 500 nanometers; and
   (C) at least one coating containing one or more metals selected from the group consisting of any of Groups 8 through 12 of the Periodic Table of the Elements, chromium, lead and indium, said coating layered over said first metal, and said coating having
      (a) an Adherence Factor of at least about 70%; and
      (b) a Conductivity Value of greater than 0.1 reciprocal ohm per meter in at least about 70% of the polymer.

3. The metallized polymer of claim 1 or 2 wherein x is 1 to 4 and the repeating unit of polymer is further substituted with one or more members selected from the group consisting of halogen and $C_yH_{2y+1}$ wherein y is 1 to 10.

4. The metallized polymer of claim 3 wherein the polymer is selected from the group consisting of poly(paraphenylene terephthalamide), poly(metaphenylene isophthalamide), poly(parabenzamide), poly(4,4'-biphenylene isophthalamide), poly(chloroparaphenylene isophthalamide) and copolymers thereof.

5. The metallized polymer of claim 4 wherein the polymer is poly(paraphenylene.terephthalamide).

6. The metallized polymer of claim 5 wherein copper is coated over the metal silver.

7. The metallized polymer of claim 4 wherein the polymer is poly(metaphenylene isophthalamide).

8. The metallized polymer of claim 7 wherein silver is coated over the metal tin.

9. The metallized polymer of claim 1 wherein the metal is selected from the group consisting of copper, silver, gold, cadmium, zinc, platinum, iron, cobalt, chromium, tin, lead, rhodium, ruthenium, indium and nickel.

10. The metallized polymer of claim 9 wherein the metal is silver or copper.

11. The metallized polymer of claim 2 wherein the first metal is selected from the group consisting of silver, copper, tin, gold, nickel and palladium and the metal coated on the first metal is selected from the group consisting of copper, silver, gold, cadmium, zinc, platinum, iron, cobalt, chromium, tin, lead, rhodium, ruthenium, indium and nickel.

12. The metallized polymer of claim 11 wherein copper is coated over the first metal silver.

13. The metallized polymer of claim 11 wherein silver is coated over the first metal tin.

14. A semiconductor imbibed polymer structure comprising
(A) a polymer having at least one repeating unit —NHRCO—, wherein
R is $R^3$ or $R^1NHCOR^2$, $R^1$ and $R^3$, individually, are m-phenylene, p-phenylene, 3,3'-biphenylene, 3,4-biphenylene, 4,4'-biphenylene or 4,4'-diphenylene ether,
$R^2$ is $R^1$ or —$(CH_2)_x$—, and
x is 1 to 10;
(B) at least one metal selected from the group consisting of cadmium, zinc, iron, cobalt, lead, nickel, germanium, tin, gallium, aluminum, said metal treated with a compound that forms a semiconductor therewith; said treated metal penetrating into the polymer to a depth of up to about 500 nanometers.

15. The polymer of claim 14 wherein x is 1 to 4 and the repeating unit of the polymer is further substituted with one or more members selected from the group consisting of halogen and $C_yH_{2y+1}$ wherein y is 1 to 10.

16. The polymer of claim 15 wherein the polymer is selected from the group consisting of poly(paraphenylene terephthalamide), poly(metaphenylene) isophthalamide), poly(parabenzamide), poly(4,4'-biphenylene isophthalamide), poly(chloroparaphenylene isophthalamide) and copolymers thereof.

17. The polymer of claim 16 wherein the compound that forms a semiconductor with the metal is a sulfide or selenide.

18. The polymer of claim 17 wherein the polymer is poly(paraphenylene terephthalamide).

19. The polymer of claim 18 wherein the semiconductor contains nickel sulfide.

20. The polymer of claim 14 further comprising at least one coating containing one or more metals selected from the group consisting of Groups 8 through 12 of the Periodic Table of the Elements, chromium, lead and indium, said coating layered over the semiconductor.

* * * * *